United States Patent [19]
Kojima et al.

[11] Patent Number: 5,089,936
[45] Date of Patent: Feb. 18, 1992

[54] SEMICONDUCTOR MODULE

[75] Inventors: Hiroyuki Kojima, Ushiku; Toshio Hatsuda, Ibaraki; Takahiro Daikoku, Ushiku; Shizuo Zushi, Hadano; Fumiyuki Kobayashi, Sagamihara, all of Japan

[73] Assignee: Hitachi, Ltd., Tokyo, Japan

[21] Appl. No.: 404,341

[22] Filed: Sep. 7, 1989

[30] Foreign Application Priority Data

Sep. 9, 1988 [JP] Japan ............... 63-224646
Feb. 23, 1989 [JP] Japan ............... 1-044480

[51] Int. Cl.$^5$ ............... H02B 1/00
[52] U.S. Cl. ............... 361/387; 357/79; 357/81; 357/82; 361/388; 361/389; 439/485
[58] Field of Search ............... 361/382, 383, 385, 386, 361/388, 389, 422; 174/16.3, 252; 165/80.3, 80.4, 185; 357/79, 81, 82; 439/485

[56] References Cited

U.S. PATENT DOCUMENTS

| | | | |
|---|---|---|---|
| 3,524,497 | 4/1968 | Chu et al. | 361/385 |
| 3,911,327 | 10/1975 | Murari et al. | 361/386 |
| 4,092,697 | 5/1978 | Spaight | 361/386 |
| 4,235,283 | 11/1980 | Gupta | 165/80.4 |
| 4,254,431 | 3/1981 | Babuka et al. | 357/82 |
| 4,263,965 | 4/1981 | Mansuria et al. | 361/386 |
| 4,415,025 | 11/1983 | Horvath | 357/79 |
| 4,479,140 | 10/1984 | Horvath | 357/82 |
| 4,561,011 | 12/1985 | Kohara | 361/386 |
| 4,649,990 | 3/1987 | Kurihara et al. | 165/80.4 |
| 4,770,242 | 9/1988 | Daikoku et al. | 361/386 |

FOREIGN PATENT DOCUMENTS

| | | | |
|---|---|---|---|
| 198848 | 3/1984 | Japan . | |
| 213153 | 12/1984 | Japan . | |
| 0122248 | 6/1987 | Japan | 357/82 |
| 1126986 | 4/1965 | United Kingdom | 357/79 |

Primary Examiner—Gerald P. Tolin
Assistant Examiner—Donald A. Sparks
Attorney, Agent, or Firm—Antonelli, Terry, Stout & Kraus

[57] ABSTRACT

In a semiconductor module including a wiring substrate having one or a plurality of semiconductor devices electrically connected thereon, a housing constituted of a sealing frame and a ceiling board to enclose the semiconductor devices therein, and a cooling jacket to cool the semiconductor devices. The semiconductor module comprises an elastic arm placed on the cooling jacket for exerting pressure to cause the cooling jacket to be uniformly contacted with the housing ceiling board, and clamping jigs press the cooling jacket and the ceiling board through the elastic arm, so that the clamping jigs may serve to press the respective intermediate positions of the four sides of the cooling jacket through the elastic arm, or screw fasteners may be provided on the elastic arm for controlling the displacements and pressing force.

20 Claims, 6 Drawing Sheets

SEMICONDUCTOR MODULE

BACKGROUND OF THE INVENTION

1. Field of the Invention

The present invention relates to a semiconductor module and, more particularly, to the semiconductor module wherein a cooling jacket, which conducts/radiates heat generated from the high-density packaged module, is mounted on a housing of this module to uniformly closely contact with the housing.

2. Description of the Prior Art

A semiconductor module containing one or more semiconductor devices is disclosed, for example, in Japanese Unexamined Patent Publication No. 59-213153. In a cooling apparatus disclosed in this publication, a heat conductive plate is placed in contact with the back surfaces of semiconductor chips, and a cooling board having cooling fluid flowing channels formed therein is then placed on this heat conductive plate, so that heat generated from the semiconductor chips is conducted through the heat conductive plate to the cooling board where the heat is absorbed and radiated by the cooling fluid. In this case, the cooling board is detachably mounted on the heat conductive plate by screw fasteners.

In Japanese Unexamined Patent Publication No 60-198848, a cooling apparatus is proposed wherein a mount housing includes a heat-radiating covering within which cooling fluid flowing channels are formed, such a covering being placed in contact with semiconductor chips on a substrate, and a spring to cause this heat-radiating covering to be tightenedly connected with the semiconductor chips.

In the above-mentioned Japanese Unexamined Patent Publication No. 59-213153 a cooling jacket or cooling board is mechanically fixed by the four screw fasteners onto the heat conductive plate which is a ceiling board of a module housing. Moreover, module structural members such as a flange to build up a number of the semiconductor chips, the housing with the heat conductive plate and the cooling board described previously are all joined mechanically and rigidly by screw fasteners. In such an arrangement for conducting and radiating the heat generated from the contacted semiconductor chips, because this contact condition between the cooling board and the heat conductive plate has a great influence on the cooling efficiency, it is inevitable for these structural members must be securely interconnected by the screw fasteners. Such secure screw-fastening does not give any trouble to the module housing of metallic material, but when brittle material, e.g., light-weighted non-metallic material is used for decreasing the weight of the module as required according to increase of the size, there is caused a problem that the module structural members are cracked by the screw-fastening. Furthermore, since packaging space is reduced due to the high-density packaging, the module structural members are fused by soldering or the like. In this case, the strong screw-fastening interferes heat deformation of the module, with thermal stress concentrating at joined portions of the structural members, and consequently, the fused portions tend to be broken, although mechanically fastened portions have some allowance against the heat deformation.

Moreover, in the above mentioned Japanese Unexamined Patent Publication No. 60-198848, in order to avoid the use of a screw-fastening, the only spring provided within the mount housing serves to press the heat-radiating covering onto the circuit substrate with the semiconductor chips mounted thereon, but with such an arrangement it is difficult to control displacements and pressing force so that the heat-radiating covering cannot be suitably fitted t the surfaces of the semiconductor chips and occupy the gaps between the covering and the respective semiconductor chips. It is also difficult to control the pressing force, whose amount has been determined in assembling, in response to differences in size of the module structural members and environmental changes after assembling.

SUMMARY OF THE INVENTION

To solve the above-stated problems of the conventional methods, an object of the present invention is to provide a highly reliable semiconductor module without stress concentration in structural members, wherein a cooling jacket and a ceiling board of a housing are pressed to be in equally close contact relationship by means of contact pressure supplying jigs.

The present invention is also intended to provide a semiconductor module, wherein the cooling jacket is not directly screw-fastened onto the ceiling board of the module, but held against it by elastic means for latching the cooling jacket so that the cooling jacket and the ceiling board are in contact to allow heat deformation of the module structural members.

To achieve such objects as described above, a semiconductor module according to the present invention is so arranged that it includes a wiring substrate having one or a plurality of semiconductor devices electrically connected thereon, a housing constituted of a sealing frame and a ceiling board to enclose these semiconductor devices therein, and a cooling jacket to cool the semiconductor devices, as well as means for electrically connecting itself to the outside circuits, which semiconductor module comprises at least one elastically deformed pressing arm provided on the cooling jacket for exerting pressure to cause the cooling jacket to be equally contacted with the housing ceiling board, and means for pressing the respective intermediate positions of the four sides of the cooling jacket and the ceiling board through this pressing arm.

In the above-stated semiconductor module of the present invention, one or a plurality of semiconductor chips, or generally a large number of semiconductor chips mounted on the ceramic wiring substrate are sealed up by the housing (a sealing cap) constituted of the sealing frame and the ceiling board, and the cooling jacket for conducting/radiating heat generated from the semiconductor chips is correspondingly placed in contact with this sealing cap. Then, such a contact condition between the cooling jacket and the ceiling board is an important factor in increasing efficiency of conducting/radiating the heat generated from the semiconductor chips.

The ceiling board and the cooling jacket may be assumed as two superposed thin plates as has been well-known, and when the four corners of the plates are pressed, the central portions are deformed in curvature due to the deformation characteristic of the plates. Therefore, the ceiling board and the cooling jacket are arranged to be pressed from both upper and lower sides by contact pressure, and such pressed portions are located at the four lateral sides and the center of the ceiling board and the cooling jacket for avoiding these members from the bending deformation, so that the ceiling board and the cooling jacket can be uniformly pressed to be firmly contacted with each other. In addition, the pressed portion of the module structural members are pressed by contact pressure free from the generation of partial tensile stress so as to prevent breakage of the structural members due to the brittleness.

In the semiconductor module of the present invention, the elastic means for pressing the cooling jacket onto the ceiling board are provided with means for controlling displacements and pressing force of the elastic means.

As the means for controlling displacements and pressing force, screw fasteners may be provided on the elastic means.

Moreover, the elastic means may be elastic members either for connecting a printed board with the cooling jacket or for connecting the wiring substrate with the cooling jacket.

Furthermore, a layer of heat conductive grease can be interposed between the cooling jacket and the ceiling board in the above semiconductor module.

There may be also provided a computer package comprising the printed board which includes the means for electrically connecting the module with the outside circuits, the semiconductor module described previously which is detachably mounted on this printed board, and frames fastened onto the printed board for surrounding the semiconductor module.

In such arrangement, the cooling jacket has a box-like structure in which cooling fluid flowing channels are provided, and the semiconductor module has also the box-like structure of the sealing cap and the ceramic substrate. When these component parts of the box-like structure are mounted on the printed board, they are entirely deformed in curvature due to generated heat. In this case, the component parts of the box-like structure are respectively interconnected at the four sides by the elastic means, and uniformly pressed onto each other without restricting the heat deformation. The elastic means are further provided with the means for controlling displacements and pressing force, so that the force for pressing the cooling jacket onto the ceiling board can be controlled to satisfy the demands.

DETAILED DESCRIPTION OF THE PREFERRED EMBODIMENTS

In developing the present invention, contact conditions of two metal plates through simulation were examined with two metal plates being placed one above the other, and clamped with screw fasteners at the four corners, the respective central positions of the four sides, and the center of the metal plates. Due to a bending deformation characteristic of these metal plates when clamped together, it was thus found that the plates were not sufficiently brought into contact by screw-clamping the four corners of the metal plate, and that the respective central positions of the four sides and the center of the plates most effectively caused close contact of these plates by means of screw-clamping.

In addition, screw-clamping of the conventional method for increasing contact closeness brings about high tensile stress in screw-fastened areas of the structural members. Besides, non-metallic material has about 1/5 to 1/10 tensile strength in comparison with the crushing strength thereof, exhibiting its extremely weak characteristic when affected with tensile load.

Therefore, it is suggested in the present invention that a cooling jacket and a housing ceiling board be clamped together and pressed by contact pressure to avoid tensile stress concentration and induce compressive stress distribution. It is also suggested that these clamped portions are located at intermediate positions or, more particularly, at the respective central positions of the four sides of the plates as well as at the center of the plates, so that there can be provided a semiconductor module which is highly reliable in strength and cooling efficiency.

Figure 1:
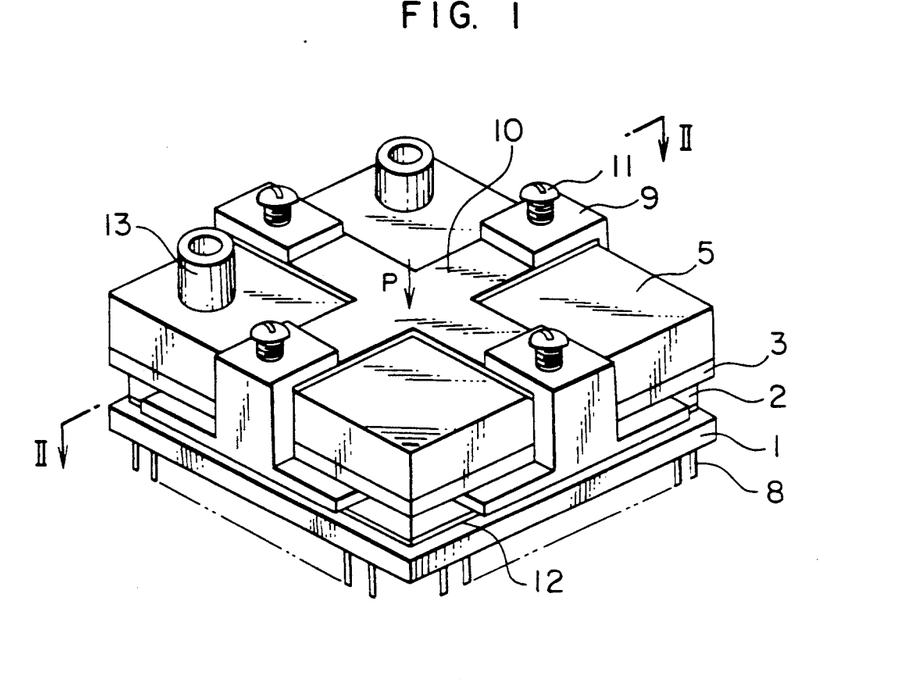
FIG. 1 is a perspective view of a semiconductor module according to a first embodiment of the present invention.
Figure 2:
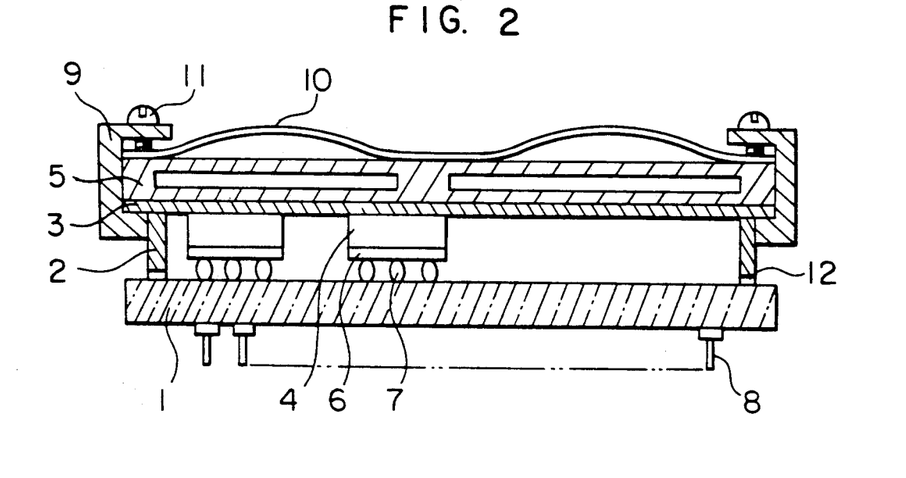
FIG. 2 is a cross-sectional view taken along a line II—II of FIG. 1.

In accordance with the present invention, as shown most clearly in FIGS. 1 and 2, at least one semiconductor chip 6 of a semiconductor device is mounted on a plurality of solder balls 7 which are electrically connected onto the top surface of a ceramic substrate 1 serving as a wiring board. Input/output pins 8 for electrically connecting the solder balls 7 with front and internal wiring of the ceramic substrate 1 are also soldered onto the bottom surface of this ceramic substrate 1 to connect the semiconductor chip 6 to the outside circuits.

In order to constitute the semiconductor module of a box-like structure in which the semiconductor chip 6 is tightly sealed with a sealing cap, there is further provided a housing including a sealing frame 2 and a ceiling board 3 of light-weighted material having high heat conduction, e.g., ceramic material which are mounted on the above ceramic substrate 1 serving as the bottom.

Contact faces of the ceramic substrate 1 and the sealing frame 2, which have been metallized in advance, have solder 12 interposed therebetween so that these contact faces are subjected to high temperature fusion and solidified, thereby enabling a tight connection of the ceramic substrate 1 and the sealing frame 2.

The ceiling board 3 of the housing is provided with cooling means 4 which are placed between the inner or lower surface of this ceiling board 3 and the semiconductor chip 6 for conducting generated heat from the semiconductor chip 6 to the ceiling board 3, and a cooling jacket 5 including coolant conduits 13, through which cooling fluid is admitted and discharged, is mounted on the outer or upper surface of the ceiling board 3 for conducting the heat of the semiconductor chip 6 through the contacted ceiling board 3 to absorb-/radiate it.

The cooling jacket 5 has a cross-shaped pressing arm 10 (FIG. 1) mounted thereon, which is elastically deformed to be arcuate with the convex central portion facing the upper surface of the cooling jacket 5 (FIG. 2), and clamping jigs 9 (contact pressure supplying jigs) are located over the four ends of the cross-shaped pressing arm 10 respectively, i.e., over the respective central positions of the four sides of the cooling jacket 5 and the ceiling board 3 as shown in FIG. 1, so as to clamp the cooling jacket 5 and the ceiling board 3 and press them with screw fasteners 11 while deforming the pressing arm 10.

According to this embodiment, the cooling jacket 5 and the ceiling board 3 are pressed not only by contact pressure at the respective contact faces of the pressing jigs 9, but also by pressure at the center P of the cooling jacket 5 which is an elastic deformation fulcrum of the pressing arm 10, so that the cooling jacket 5 can be equally connected to the ceiling board 3 in a strong and reliable contact condition.

In this embodiment as described above, the close contact between the ceiling board of the housing and the cooling jacket can be achieved by clamping them with the pressing jigs 9. Such clamping is performed by the contact pressure caused at the contact faces of the pressing jigs and the ceiling board or the cooling jacket. Consequently, partial concentration of tensile stress in the structural members can be avoided, and ultimate strength of the clamped portions can be increased, so as to ensure sufficient clamping force.

As a result, the cooling jacket and the ceiling board can be firmly interconnected for providing the semiconductor module which is highly reliable in heat conductive cooling efficiency and strength.

Figure 3:
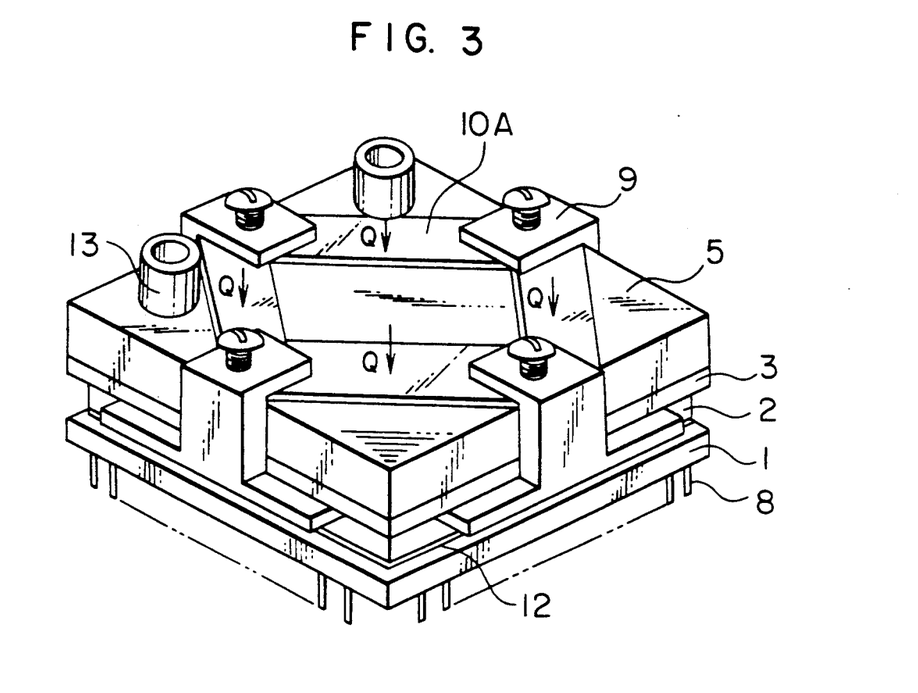
FIG. 3 is a perspective view of a semiconductor module according to a second embodiment of the present invention.

In the embodiment of FIG. 3, the cooling jacket 5 has a pressing arm 10A mounted thereon, whose sides diagonally extend across the four corner portions of the cooling jacket 5 and are elastically deformed to be arcuate with the convex central portions facing the upper surface of the cooling jacket 5. This pressing arm 10A has a rectangular configuration as illustrated in FIG. 3, and the clamping jigs 9 are located over the four corners of the rectangular configuration of the pressing arm 10A respectively, i.e., over the respective central positions of the four sides of the cooling jacket 5 and the ceiling board 3. These clamping jigs 9 serve to clamp the cooling jacket 5 and the ceiling board 3 and press them with the screw fasteners 11 while deforming the pressing arm 10A.

In this manner, the cooling jacket 5 and the ceiling board 3 are pressed not only by contact pressure at the respective contact faces of the pressing jigs 9, but also by pressure at the centers Q of the respective convex sides of the pressing arm 10A, i.e., elastic deformation fulcrums hereof, so that the cooling jacket 5 can be equally connected to the ceiling board 3 in the reliable contact condition. That is to say, the embodiment shown in FIG. 3 is supposed to take the same effects as the first embodiment of FIGS. 1 and 2.

Figure 4:
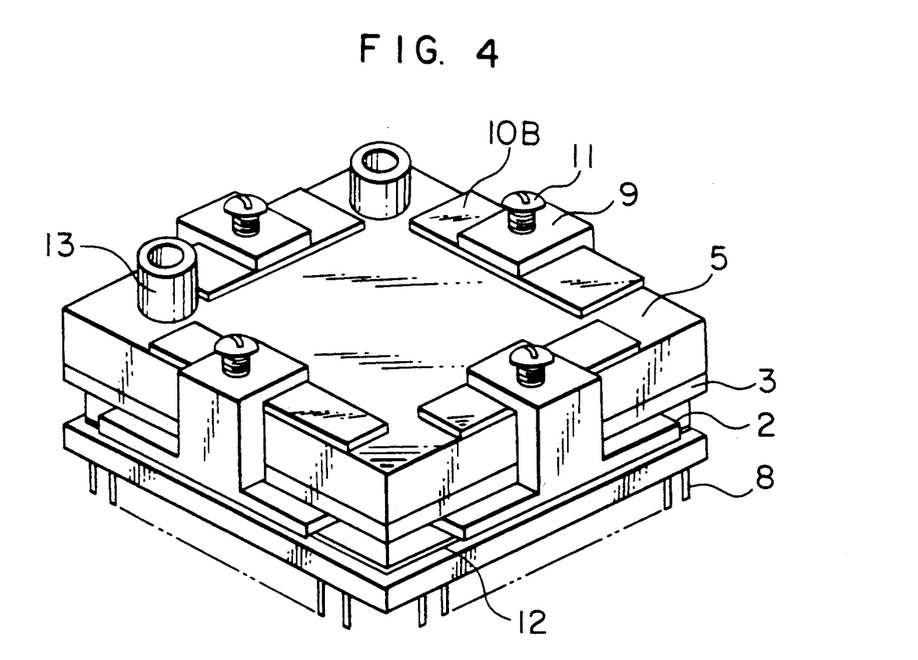
FIG. 4 is another perspective view of a semiconductor module according to a third embodiment of the present invention.

In the embodiment of FIG. 4, the cooling jacket 5 has pressing arms 10B mounted thereon, which respectively extend along the four sides of the cooling jacket 5, and the clamping jigs 9 are located at the same positions as these pressing arms 10B, i.e., over the respective central positions of the four sides of the cooling jacket 5 and the ceiling board 3. These clamping jigs 9 serve to clamp the cooling jacket 5 and the ceiling board 3, and then the pressing arms 10B are pressed with the screw fasteners 11. Each pressing arm 10B may be elastically deformed to be arcuate with the concave central portion facing the upper surface of the cooling jacket 5, or given a larger thickness for enabling the flexural rigidity to increase, and a wider region can be strongly pressed by contact pressure accordingly.

Therefore, the embodiment shown in FIG. 4 is supposed to take the same effects as the respective embodiments mentioned previously.

Moreover, the present invention can be applied to the semiconductor module containing one or a plurality of semiconductor chips.

Furthermore, in the respective embodiments described above, although the central positions of the four sides of the cooling jacket and the housing ceiling board each has one clamping jig fixed thereon, a plurality of clamping jigs can be respectively supplied at intermediate positions of the four sides of these structural members when they are of a larger size.

According to those structures explained hereinbefore, the cooling jacket and the ceiling board of the housing are clamped and pressed to have equally strong contact by means of the contact pressure supplying jigs so that there can be provided such a reliable semiconductor module as to keep the structural members from the stress concentration.

Figure 5:
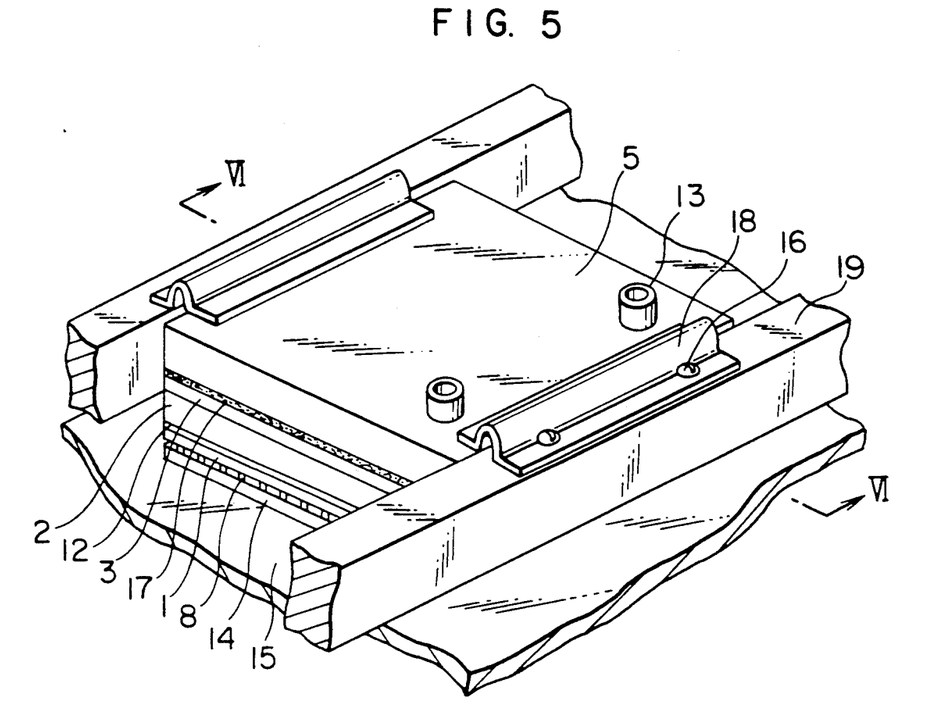
FIG. 5 is a perspective view showing a fourth embodiment of the present invention.
Figure 6:
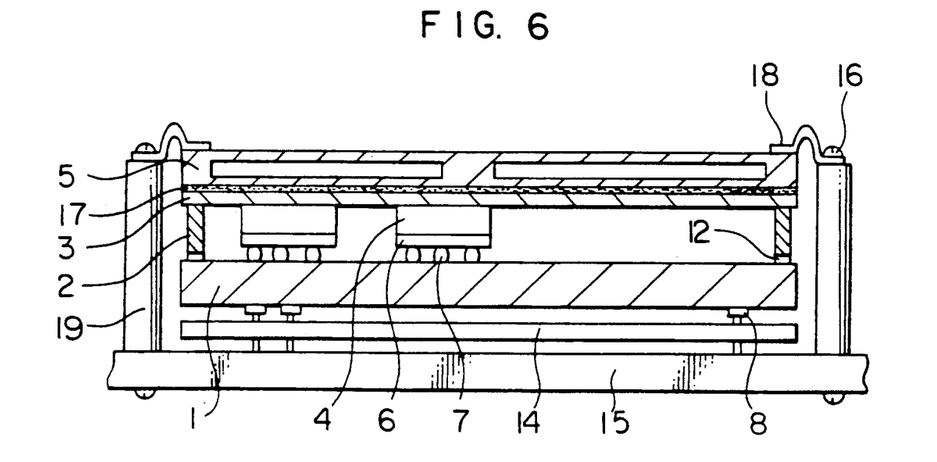
FIG. 6 is a cross-sectional view taken along a line VI—VI of FIG. 5.

In the embodiment of FIGS. 5 and 6, a layer of heat conductive grease 17 is interposed between the upper surface of the ceiling board 3 and the cooling jacket 5 to increase the mutual heat conduction thereof.

A module assembly of the ceramic substrate 1, the semiconductor chip 6, the housing, and the cooling jacket 5 as mentioned above, in which the input/output pins 8 are inserted into a connector 14 set on a printed board 15, is electrically connected to the outside circuits for constituting a computer package.

Frames 19 are mounted on the printed board 15 to surround the module assembly, and one surface of each frame 19 is threadably secured on this printed board. Meanwhile, a pressing member 18 of elastic material, performed as a flange member having a U-shaped cross section, has one flange fastened by screw fasteners 16 on the opposite surface of each frame 19 at a position corresponding to the cooling jacket 5, and then the other flange of this pressing member 18 is brought into contact with the upper surface of the cooling jacket 5. The screw fasteners 16 serve to control the position of this free flange of each pressing member 18 and the force of pressing the cooling jacket 5.

According to this embodiment, the ceiling board 3 and the cooling jacket 5 are pressed by contact pressure at the contact faces of those pressing members 18. Due to the elastic characteristics of the pressing members 18, they are deformed to follow up heat deformation of the module assembly including the cooling jacket 5.

As a result, even if the module assembly is heat-deformed, the cooling jacket and the ceiling board can be maintained in a contact relationship, and the cooling jacket is pressed onto the ceiling board while following the heat deformation of the module assembly, so that there can be provided the semiconductor module which is highly reliable in heat conductive cooling efficiency and strength. In addition, even if the module assembly, the cooling jacket or the pressing members have size errors, the optimum pressing force can be obtained by controlling the screw fasteners 16.

Figure 7:
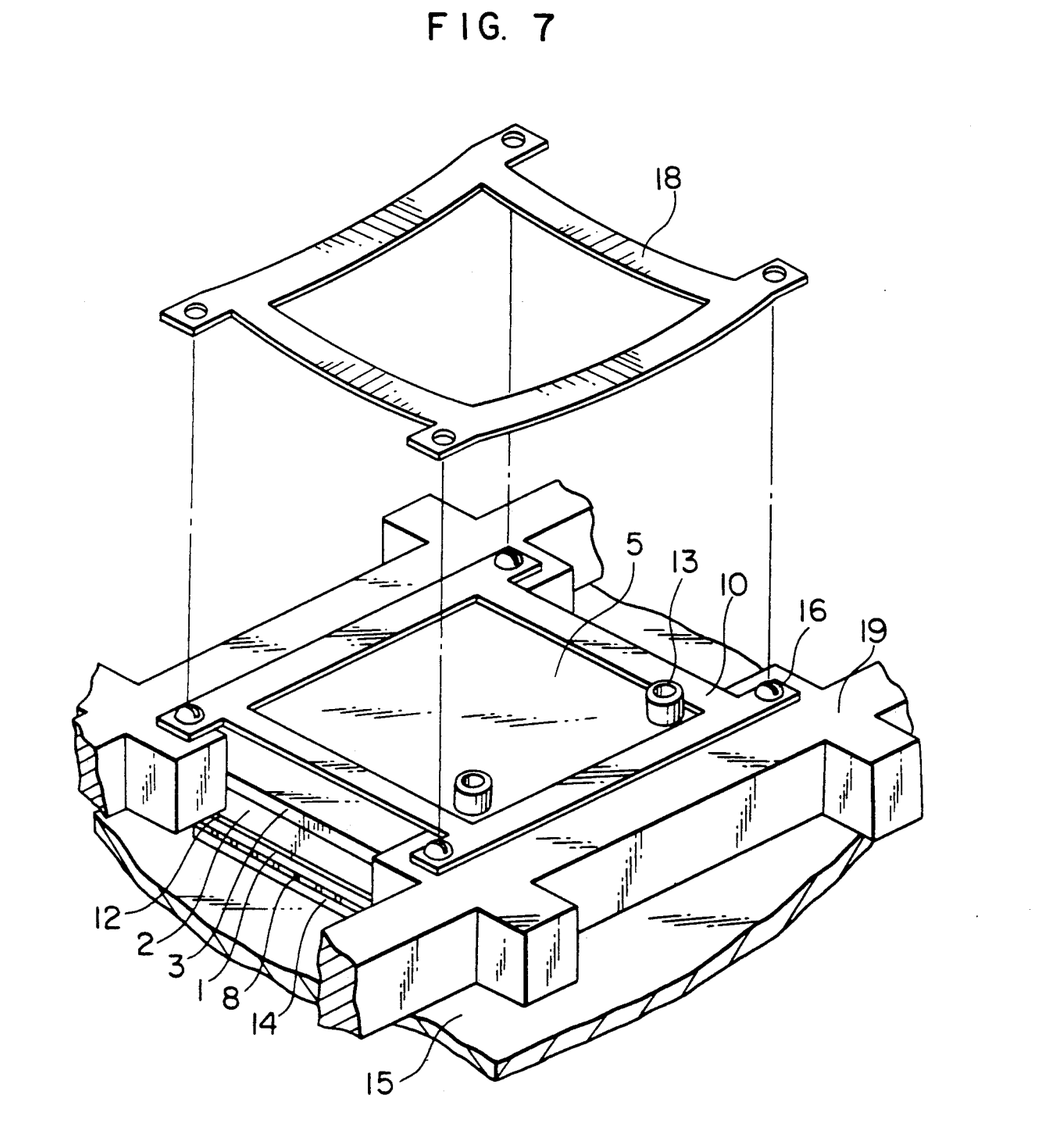
FIG. 7 is a perspective view showing a fifth embodiment of the present invention.

In the embodiment of FIG. 7, the cooling jacket 5 has a pressing member 18 of elastic material mounted thereon, whose respective sides corresponding to the four sides of the cooling jacket 5 are formed to be arcuate with the convex central portions facing the upper surface of the cooling jacket 5, and by means of the screw fasteners 16 for controlling displacements and pressing force, as illustrated in FIG. 7, the pressing member 18 is elastically deformed and screwed on the top surfaces of the frames 19 whose bottom surfaces are screwed on the printed board 15, so that the cooling jacket is pressed by this pressing member.

In this manner, the cooling jacket 5 and the ceiling board 3 are pressed by contact pressure on the contact faces at the central portions of the respective sides of the pressing member 18. Due to the elastic deformation mechanism of the pressing member 18, even if the module assembly causes heat deformation (curvature), the deformation is not restricted by the rigidity, and the pressing member 18 can provide the reliable contact condition. That is to say, the embodiment of FIG. 7 is supposed to take the same effects as the above-stated embodiments shown in FIGS. 5 and 6. If the cooling jacket and the ceiling board have the thin layer of heat conductive grease 17 formed therebetween, the heat conduction can be kept from decreasing of it when the heat deformation is caused.

Figure 8A:
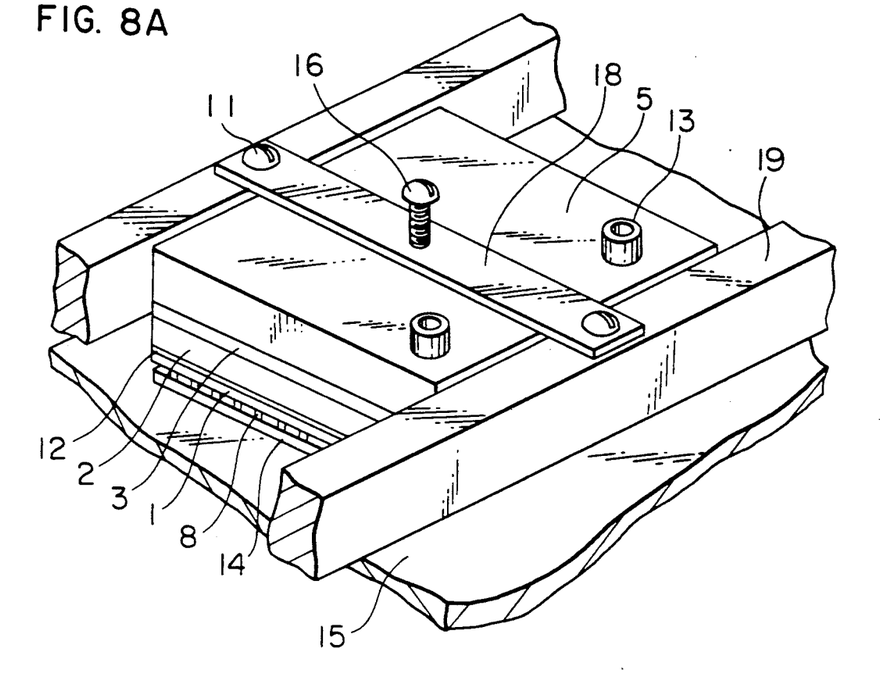
FIG. 8A is a perspective view showing a sixth embodiment of the present invention.
Figure 8B:
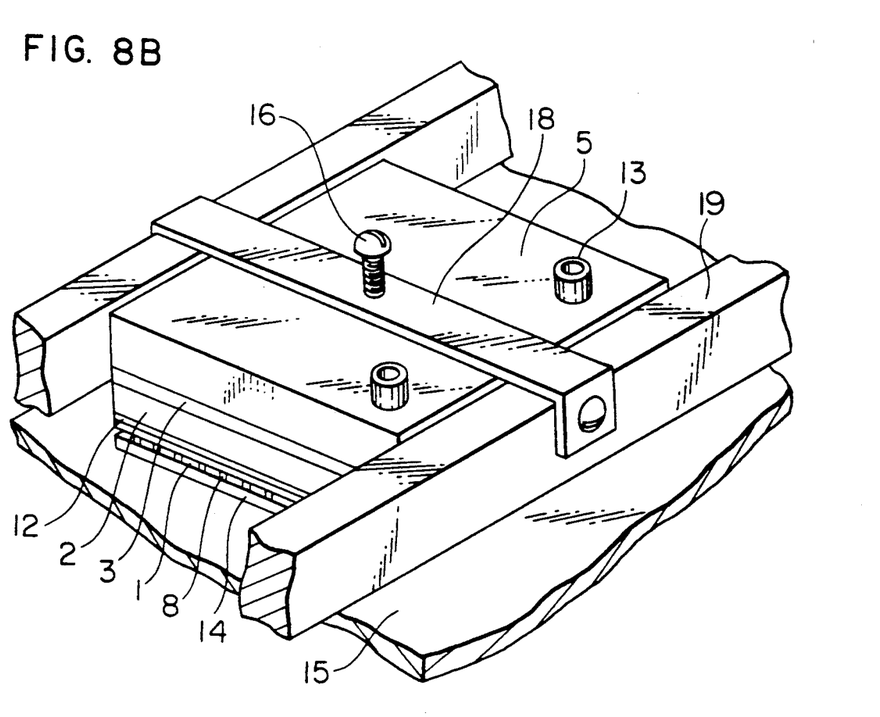
FIGS. 8B and 8C are perspective views showing modifications of the sixth embodiment.
Figure 8C:
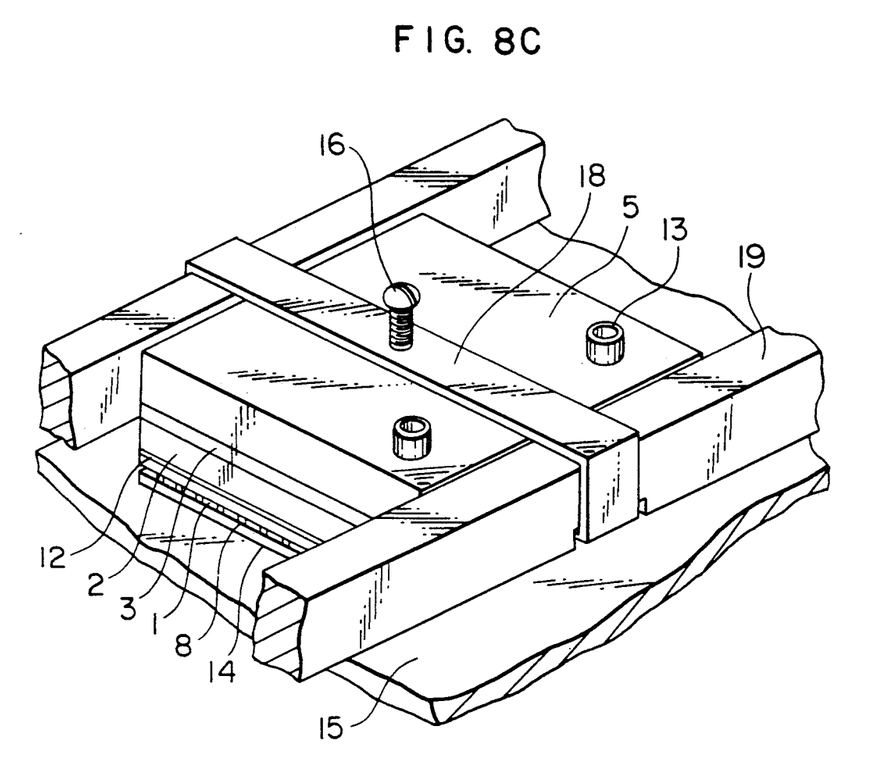

In the embodiment of FIG. 8A, the frames 19 are screwed in parallel on the upper surface of the printed board 15 to have the cooling jacket 5 interposed therebetween, and the pressing member 18 is located above this cooling jacket 5 with its surfaces extending substantially in parallel with the upper surface of the cooling jacket 5, while both ends of the pressing member 18 are fastened on the frames 19 with the screw fasteners 11. The central portion of the pressing member 18, which is positioned between these frames 19, is formed with a threaded hole, and the pressing screw fastener 16 for controlling displacements and pressing force is screwed in this threaded hole, with the tip of the pressing screw fastener 16 being in contact with the upper surface of the cooling jacket 5. When the pressing screw fastener 16 is driven into the threaded hole, the tip of this pressing screw fastener 16 is forced against the cooling jacket 5 so that the cooling jacket 5 is pressed by the pressing screw fastener 16 due to elastic deformation of the pressing member 18. The pressing force is controlled according to the driving force of the pressing screw fastener. Therefore, the embodiment shown in FIG. 8A is supposed to take the same effects as the respective embodiments described above. In addition, although the pressing member 18 in this embodiment of FIG. 8A is screwed on the top surfaces of the frames 19, it may be screwed on the side walls of these frames 19 as illustrated in FIG. 8B, and the bottom surfaces of the frames 19 in contact with the printed board 15 may be formed with recessed sections, with which the hooked end portions of the pressing member 18 are engaged, as in FIG. 8C.

Figure 9:
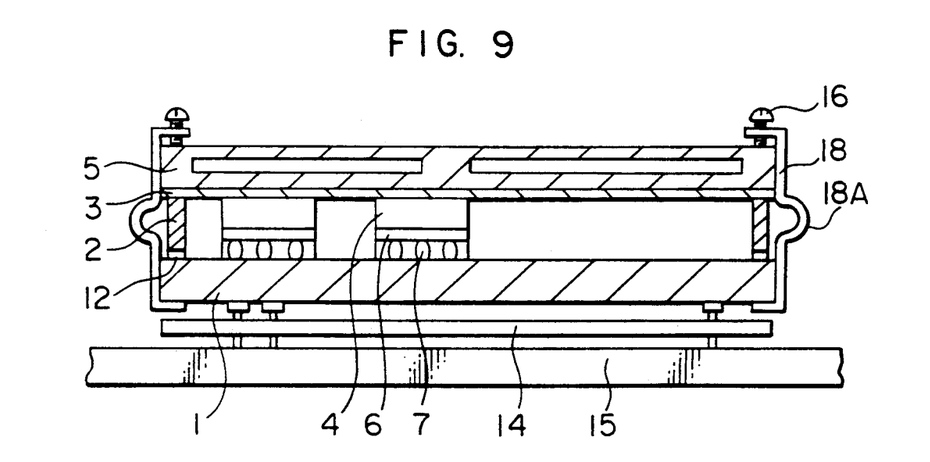
FIG. 9 is a cross-sectional view showing a seventh embodiment of the present invention.

In the embodiment of FIG. 9, the pressing members 18 of channel elements having a U-shaped cross section are provided for clamping and screwing the ceramic substrate 1 and the cooling jacket 5 of the module assembly. The central portion (the U-shaped cross-sectional web portion) of each pressing member 18 is formed with a curved section 18A in advance, and the lower flange of the U-shaped cross section is in contact with the ceramic substrate 1, while the tip of the screw fastener 16 which is engaged in the upper flange of the U-shaped cross section is in contact with the cooling jacket 5. With a screw-engaged point of this upper flange of the pressing member 18 serving as a fulcrum, the cooling jacket 5 is pressed by the screw fastener 16 for controlling the displacements and pressing force. The curved section 18A exerts as its elastic deformation mechanism and serves to absorb reaction against such pressing force. This curved section 18A has another mechanism that it is deformed to follow heat deformation of the module assembly so that the module assembly may not be held by excessive force.

In the same manner of the other embodiments described previously, because the cooling jacket of this embodiment is also pressed by a combination of the elastic members and the screw fasteners, the displacements and pressing force can be controlled according to environments either in assembling or during operation, and the heat generated from the semiconductor chip can be removed without causing excessive thermal stress in areas where the ceramic substrate, the sealing frame, and the cooling jacket are contacted with one another while maintaining the required pressing force.

As explained heretofore, according to the present invention, the cooling jacket and the housing ceiling board are tightly interconnected by the elastic pressing members, and such pressing is controlled by the screw fasteners, so that heat deformation of the module assembly may not be restricted, and that the cooling jacket can be pressed on the housing ceiling board while following the heat deformation, thereby providing such a reliable semiconductor module as to prevent the module structural members from stress concentration.

What is claimed is:

1. A semiconductor module including a wiring substrate having at least one semiconductor device electrically connected thereto; a housing including a sealing frame and ceiling board to enclose the at least one semiconductor device therein; a cooling jacket to cool said at least one semiconductor device, said cooling jacket including conduit means for enabling a flow of coolant therethrough; means for electrically connecting the semiconductor device to outside circuits; elastic means for exerting pressure on said cooling jacket to cause said cooling jacket to contact said ceiling board with equal pressure at plural locations; and means for pressing respective intermediate positions of four sides of the cooling jacket and the ceiling board through said elastic means.

2. The semiconductor module according to claim 1, wherein said elastic means includes at least one elastically deformed pressing arm provided on said cooling jacket.

3. The semiconductor module according to claim 1, wherein said elastic means includes a pressing arm having a cross configuration, said pressing arm being elastically deformable so as to be arcuate with a convex central portion facing the cooling jacket, and wherein respective end portions of said pressing arm are disposed at the intermediate positions of the respective sides of said cooling jacket and said ceiling board.

4. The semiconductor module according to claim 1, wherein said elastic means includes a pressing arm having a rectangular configuration, and wherein respective corners of said pressing arm are disposed at the intermediate positions of the respective sides of said cooling jacket and said ceiling board.

5. The semiconductor module according to claim 1, wherein said elastic means includes pressing arms extending along the four sides of the cooling jacket, said pressing arms being elastically deformable so as to be arcuate with concave central portions facing an upper surface of said cooling jacket.

6. A semiconductor module including a wiring substrate having at least one semiconductor device electrically connected thereto; a housing including a sealing frame and ceiling board mounted on said wiring substrate to enclose the at least one semiconductor device therein; a cooling jacket in contact with said ceiling board to cool the at least one semiconductor device, said cooling jacket including conduit means for enabling a flow of coolant therethrough; elastic means for pressing said cooling jacket onto the ceiling board; and means acting on said elastic means for controlling a displacement of said cooling jacket and force applied by the elastic means on said cooling jacket.

7. A semiconductor module including a wiring substrate having at least one semiconductor device electrically connected thereto; a housing including a sealing frame and a ceiling board mounted on said wiring substrate to enclose the at least one semiconductor device therein; a cooling jacket in contact with said ceiling board to cool the at least one semiconductor device; elastic means for pressing said cooling jacket onto the ceiling board; and means acting on said elastic means for controlling a displacement of said cooling jacket and force applied on the elastic means on said cooling jacket including screw fasteners provided on the elastic means.

8. The semiconductor module according to claim 7, wherein said elastic means include elastic members for connecting a printed board with the cooling jacket.

9. The semiconductor module according to claim 7, wherein said elastic means includes elastic members for connecting the wiring substrate with the cooling jacket.

10. A semiconductor module according to claim 6, wherein said means for controlling applies a pressure to an upper surface of said cooling jacket and a lower surface of ceiling board.

11. A semiconductor module according to claim 6, wherein said means for controlling applies a pressure to an upper surface of said cooling jacket and a lower surface of said wiring substrate.

12. A semiconductor module including a wiring substrate having at least one semiconductor device electrically connected thereto; a housing including a sealing frame and a ceiling board for enclosing said at least one semiconductor device therein; a cooling jacket to cool said at least one semiconductor device, said cooling jacket including conduit means for enabling a flow of coolant therethrough; means for electrically connecting the semiconductor module to outside circuits; elastic means for pressing said cooling jacket onto the housing ceiling board; means for controlling a displacement of said cooling jacket and pressing force of the elastic means acting on said cooling jacket and the ceiling board; and a layer of heat conductive grease interposed between said cooling jacket and said ceiling board.

13. A computer package comprising a semiconductor module including a wiring substrate having at least one semiconductor device thereon; a housing including a sealing frame and a ceiling board for enclosing said at least one semiconductor device therein; a cooling jacket to cool said at least one semiconductor device; means for electrically connecting the semiconductor device to the wiring board; elastic means for pressing said cooling jacket onto the ceiling board; means for controlling a displacement of said cooling jacket and a force of the elastic means acting on said cooling jacket and the ceiling board; a layer of heat conductive grease interposed between the cooling jacket and the ceiling board; a printed board including means for electrically connecting the semiconductor module so that the semiconductor module can be detachably mounted thereon; and frames fastened on said printed board to surround said semiconductor module.

14. A semiconductor module comprising: a wiring substrate having at least one semiconductor device electrically connected thereto; a housing including a sealing frame and ceiling board for enclosing the at least one semiconductor device therein; a cooling jacket to cool said at least one semiconductor device, said cooling jacket including conduit means for enabling a flow of coolant therethrough; means for electrically connecting the semiconductor module to outside circuits; elastic means for exerting a pressure on said cooling jacket so as to cause said cooling jacket to be in equal contact with said ceiling board, said elastic means pressing a central portion of the cooling jacket so as to prevent a formation of a gap generated by a heat deformation between said cooling jacket and said ceiling board. of a gap generated by heat deformation between said cooling jacket and said ceiling board.

15. The semiconductor module according to one of claims 1, 6, 12 or 13, wherein said elastic means presses a central portion of the cooling jacket so as to prevent formation of a gap generated by heat deformation between said cooling jacket and said ceiling board.

16. A semiconductor module including a wiring substrate having one or a plurality of semiconductor devices electrically connected thereon, a housing constituted of a sealing frame and a ceiling board which is mounted on said wiring substrate to enclose said semiconductor devices therein, and a cooling jacket provided in contact with said ceiling board to cool the semiconductor devices, wherein said semiconductor module comprises elastic means for pressing said cooling jacket onto the ceiling board, and means for controlling displacements and force of said elastic means including screw fasteners provided on the elastic means.

17. The semiconductor module according to claim 16, wherein said elastic means include elastic members for connecting a printed board with the cooling jacket.

18. The semiconductor module according to claim 16, wherein said elastic means include elastic members for connecting the wiring substrate with the cooling jacket.

19. A semiconductor module including a wiring substrate having at least one semiconductor device electrically connected thereto; a housing including a sealing frame and a ceiling board mounted on said wiring substrate to enclose that at least one semiconductor device therein; a cooling jacket in contact with said ceiling board to cool the at least one semiconductor device; an elastic means for pressing said cooling jacket onto said ceiling board; and means acting on said elastic means for controlling a displacement of said cooling jacket and force applied by the elastic means on said cooling jacket, wherein said elastic means includes elastic members for connecting a printed board with the cooling jacket.

20. A semiconductor module including a wiring substrate having at least one semiconductor device electrically connected thereto; a housing including a sealing frame and a ceiling board mounted on said wiring substrate to enclose the at least one semiconductor device therein; a cooling jacket in contact with said ceiling board to cool the at least one semiconductor device; an elastic means for pressing said cooling jacket onto said ceiling board; and means acting on said elastic means for controlling a displacement of said cooling jacket and force applied by the elastic means on said cooling jacket, wherein said elastic means includes elastic members for connecting the wiring substrate with the cooling jacket.

* * * * *